United States Patent [19]

Samata et al.

[11] Patent Number: 5,378,652
[45] Date of Patent: Jan. 3, 1995

[54] METHOD OF MAKING A THROUGH HOLE IN MULTI-LAYER INSULATING FILMS

[75] Inventors: Shuichi Samata, Yokohama; Yuuichi Mikata, Kawasaki; Toshiro Usami, Yokohama, all of Japan

[73] Assignee: Kabushiki Kaisha Toshiba, Kawasaki, Japan

[21] Appl. No.: 680,781

[22] Filed: Apr. 3, 1991

Related U.S. Application Data

[63] Continuation of Ser. No. 509,736, Apr. 17, 1990, abandoned.

[30] Foreign Application Priority Data

Apr. 19, 1989 [JP] Japan .................................. 1-99265

[51] Int. Cl.⁶ ...................... H01L 29/54; H01L 21/20
[52] U.S. Cl. .................................. 437/189; 437/190; 437/89; 257/637; 257/740; 257/774
[58] Field of Search ...................... 357/40, 59 G, 59 I, 357/59 J, 59 K; 437/189, 190; 257/637, 641, 649, 774, 740, 751

[56] References Cited

U.S. PATENT DOCUMENTS

| 4,884,123 | 11/1989 | Dixit et al. | 437/190 |
| 5,116,780 | 5/1992 | Samata et al. | 437/189 |

OTHER PUBLICATIONS

Wolf et al, "Silicon Processing For VLSI ERA", Lattice Press, Sunset Beach, Calif. 1986 pp. 182-191.
"The Selective Epitaxial Growth of Si by using Silicon Nitride Film as a Mask", Ogawa et al, Jap. J. Appl. Phys., vol. 10, #12, Dec. 1971, pp. 1675-1679.
"Selective Si Epitaxy Using Reduced Pressure Technique", Tanno et al, Jap. J. Appl. Phys., vol. 21, #9, Sep. 1982, pp. L564-L566.
"Novel Device Structures by Selective Epitaxial Growth (SEG)", Borland, IEDM 1987, pp. 12-15.
"Novel Selective Poly-and Epitaxial-Silicon Growth (SPEG) Technique For VLSI Processing", Mieno et al, IEDM 1987, pp. 16-19.
Shibata, H., et al., "Low Resistive and Selective Silicon Growth as a Self-Aligned Contact Hole Filler and its Application to a 1M bit State Ram", Technical Digest for 1987 Symposium on VLSI Technology, pp. 75-76, published 1984.

*Primary Examiner*—Rolf Hille
*Assistant Examiner*—Mahshid Saadat
*Attorney, Agent, or Firm*—Finnegan, Henderson, Farabow, Garrett & Dunner

[57] ABSTRACT

A semiconductor device with an electrode wiring structure comprises at least one diffused region provided in a semiconductor substrate, a silicon oxide layer covering the substrate surface, a silicon nitride layer provided on the silicon oxide layer, a through-hole reaching the diffused region through the silicon oxide layer from an upper surface of the silicon nitride layer, a silicon semiconductor layer filled in the through-hole and serving as an electrode wiring layer, and an interconnection layer electrically connected to the diffused region through the silicon semiconductor layer. According to the structure, since the silicon oxide layer is covered with the silicon nitride layer, unwanted contaminations such as phosphorus, boron, etc., previously contained in the silicon oxide layer are not added to the silicon semiconductor layer during its growth process. Therefore, the electrode wiring layer of silicon semiconductor having controlled conductivity can be provided.

6 Claims, 4 Drawing Sheets

METHOD OF MAKING A THROUGH HOLE IN MULTI-LAYER INSULATING FILMS

This application is a continuation of application Ser. No. 07/509,736, filed Apr. 17, 1990 now abandoned.

BACKGROUND OF THE INVENTION

1. Field of the Invention

The present invention relates to a semiconductor device and a method of making the same, and more particularly, to a semiconductor device having an electrode wiring structure in the which a through-hole formed in insulating layers is filled with a conductive material.

2. Description of the Related Art

For providing an electrode wiring structure in a semiconductor device, a through-hole is formed in an insulating layer, and a conductive material is deposited on the insulating layer so as to fill the through-hole therewith. An example of such a structure will be described below with reference to the accompanying drawings.

FIG. 4 shows a drain region in a section of a semiconductor device such as a static RAM including a MOS transistor (MOSFET) as a circuit element. An N-type diffused region 2, which serve as a drain, is formed in a surface region of a P-type silicon substrate 1, and a silicon oxide layer 3 (which is also called an interlevel insulator) is deposited on the substrate 1. A through-hole 4 is provided in the insulating layer 3 so as to reach the N-type diffused region 2. An Al alloy containing 1 wt % of Si, for example, is deposited on the entire surface of the silicon oxide layer 3 by means of sputtering techniques, and the resultant metal layer is patterned to provide an interconnection layer 5. At this time, when the diameter of the through-hole is large, the through-hole is filled with the Al-Si alloy, as shown in FIG. 4, and the interconnection layer 5 is electrically connected to the N-type diffused region 2.

With a tendency toward a fine device structure, an aspect ratio of the through-hole, i.e., a depth/diameter ratio is increasing. Therefore, an unwanted cavity 6 is easily formed by a deposited configuration in the sputtering as shown in FIG. 5. Poor step coverage may occur with a certain probability, and electrical conduction may be not assured.

As a countermeasure against the above disadvantage there has been recently developed a method for depositing a conductive material into only through-holes. More particularly as such a method, it is effective to selectively and epitaxially grow a silicon layer in only the through-holes. The discontinuity in the through-holes may be substantially eliminated (e.g., Tanno et al., Jap. J. of Appl. phys., vol. 21, No. 9, 1982, p. L564). As shown in FIG. 6, after a through-hole 4 is formed in a silicon oxide layer 3 provided on a P-type silicon substrate 1 to reach an N-type diffused region 2, a silicon layer doped with an N-type impurity is epitaxially grown in only the through-hole by means of selective epitaxial growth techniques to provide a low resistivity single crystal silicon layer 7 having no thickness step with the silicon oxide layer 3. Thereafter, when an Al-Si layer is provided by the sputtering, no cavity and no discontinuity as shown in FIG. 5 will occur. Subsequently, a wiring structure is provided by well-known photoetching techniques.

In such a conventional selective epitaxial growth, a silicon oxide layer containing a large amount ($10^{19}$ atoms/cm$^3$ or more) of phosphorus or boron has been used as an insulating layer. A through-hole is formed in the silicon oxide layer, and a silicon layer is then deposited in the through-hole. Since this deposition must be performed at a high temperature of 900° C., the phosphorus or boron is evaporated from the silicon oxide layer and added to the silicon layer to be deposited in the through-hole. Accordingly, it is difficult to control the conductivity type or resistance value of the silicon layer. Since the silicon oxide layer easily absorbs unwanted impurities such as heavy metals (e.g., Fe or Ni) by gettering, it may be contaminated during the formation of the through-hole.

As described above, in a method wherein the interconnection layer is provided on the insulating layer and the conductive material is simultaneously filled in the through-hole, an unwanted cavity or discontinuity may occur at the through-hole when its aspect ratio becomes large. On the contrary, in the method wherein the silicon layer is grown in only the through-hole by means of the selective epitaxial growth and the interconnection layer is then provided, an unwanted discontinuity and the like will not occur at the through-hole, thereby eliminating the problem described above. However, in the selective epitaxial growth, when the silicon layer is deposited in the through-hole, phosphorus or boron may be evaporated from the silicon oxide layer. Accordingly, it is difficult to control the conductivity type or resistance value of the deposited silicon layer. In addition, the insulating layer may absorb heavy metals by gettering, thereby causing deterioration of the device.

SUMMARY OF THE INVENTION

Therefore, it is an object of the present invention to provide a semiconductor device wherein a conductive material deposited in a through-hole has controlled conductivity.

It is another object of the present invention to provide a semiconductor device having an insulating layer which is not contaminated by unwanted heavy metals.

It is still another object of the present invention to provide a method of making a semiconductor device with high reliability at high yield.

According to one aspect of the present invention, there is provided a semiconductor device comprising at least one diffused region selectively provided in a semiconductor substrate, a silicon oxide layer provided on the substrate surface, a silicon nitride layer provided on the silicon oxide layer, a silicon semiconductor layer with low resistivity filled in a through-hole reaching the diffused region from an upper surface of the silicon nitride layer through the silicon oxide layer, and an interconnection layer connected to the silicon semiconductor layer and provided on the silicon nitride layer.

According to another aspect of the present invention, there is provided a method of making a semiconductor device according to a principle incorporated in the firstly referred aspect of the present invention.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

DETAILED DESCRIPTION OF THE PREFERRED EMBODIMENT

An embodiment of the present invention will be described below with reference to the accompanying drawings.

Figure 1:
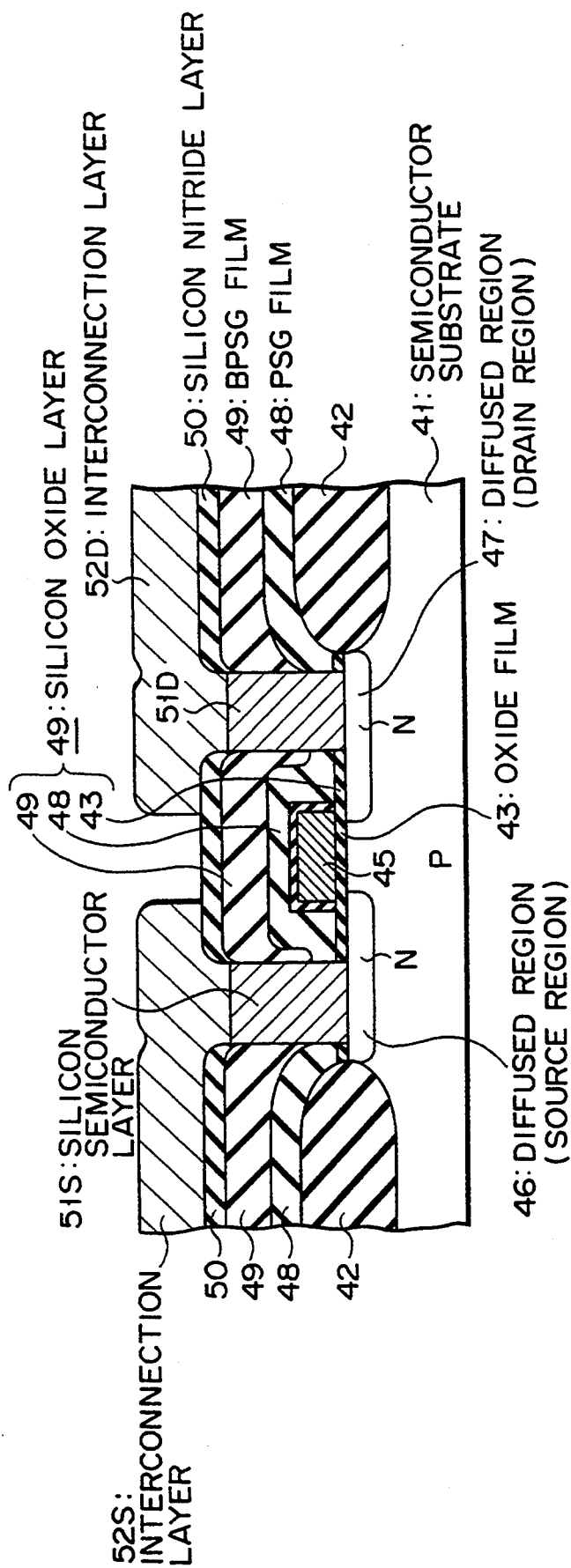
FIG. 1 is a sectional view of a MOSFET according to an embodiment of the present invention.

In an integrated circuit including MOSFETs of the present invention, a sectional view of a part of one MOSFET is shown in FIG. 1. Referring to FIG. 1, the MOSFET is provided in an isolated region which is surrounded by an SiO$_2$ layer 42 serving as an isolation region formed in a P-type Si substrate 41. That is, a gate electrode 45 is provided on a thermal oxide film (gate oxide film) 43. An N-type impurity is selectively diffused into the substrate 41 through the gate electrode serving as a mask, thereby providing diffused regions 46 and 47, i.e., a source region 46 and a drain region 47 exposed on the substrate surface. A multilevel silicon oxide layer 49, which includes the thermal oxide film 43, a silicon oxide layer 48 (PSG film) containing phosphorus and a silicon oxide layer 49 (BPSG film) containing phosphorus and boron, is formed on the diffused regions 46 and 47. A silicon nitride layer 50 is deposited on the multilevel silicon oxide layer 49. Through-holes (contact holes) are formed in the silicon nitride layer 50 and the multilevel silicon oxide layer 49 to reach the diffused regions 46 and 47, and are then filled with silicon semiconductor layers 51S and 51D having low resistivity, respectively. Interconnection layers 52S and 52D, which serve as source and drain electrodes and are in contact with the silicon semiconductor layers 51S and 51D, respectively, are provided on the silicon nitride layer 50.

A method of making the semiconductor device with the structure described above according to the present invention will be described below with reference to FIGS. 2A to 2C.

Figure 2A:
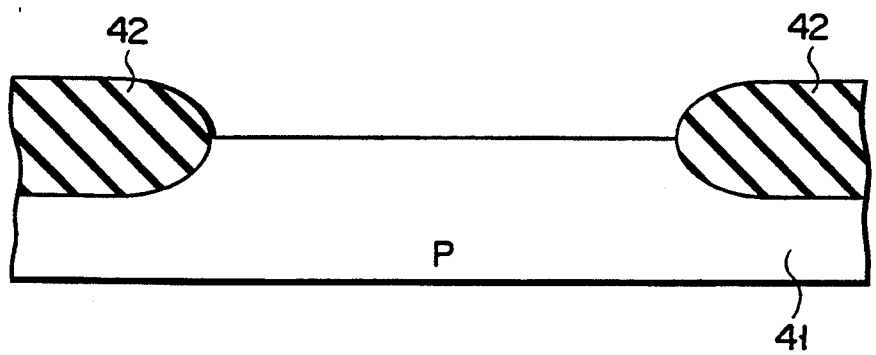
FIGS. 2A to 2C are sectional views showing manufacturing processes of the MOSFET shown in FIG. 1.

As shown in FIG. 2A, an SiO$_2$ layer 42 serving as an isolation region is formed in a P-type (100) silicon semiconductor substrate 41, using so called LOCOS techniques.

Figure 2B:
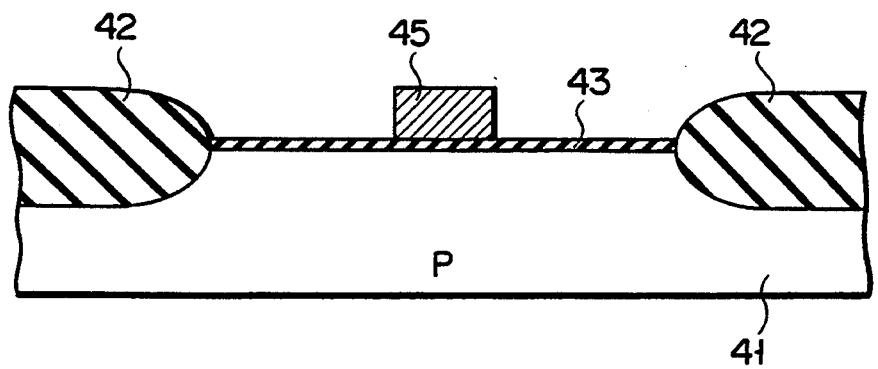

As shown in FIG. 2B, a 200 Å thick thermal oxide film 43 (gate oxide film) is formed on an isolated region. A polysilicon layer 45 is deposited on the substrate surface to a thickness of 4000 Å by means of LPCVD techniques, and then doped with phosphorus. The polysilicon layer is patterned by photolithography techniques and etched to provide a gate electrode 45.

Figure 2C:
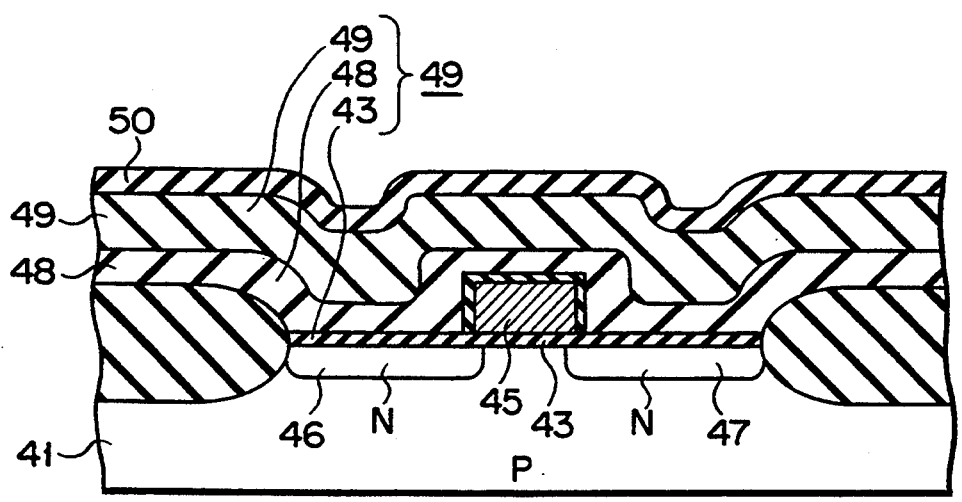

As shown in FIG. 2C, arsenic ions are implanted into the isolated region at a dose of $5 \times 10^{15}$ atoms/cm$^2$ using the gate electrode 45 as a mask, thereby providing source and drain regions 46 and 47. The substrate is oxidized at a temperature of 900° C. Thereafter, a silicon oxide layer 48 (PSG film) containing phosphorus is deposited to a thickness of 3000 Å by means of CVD techniques, and a silicon oxide layer 49 (BPSG film) containing boron and phosphorus is deposited to a thickness of 5000 Å by means of CVD techniques. A silicon nitride layer 50 is further deposited on the multilevel silicon oxide layer 49 by means of LPCVD techniques.

As shown in FIG. 1, for making an ohmic contact with source and drain regions 46 and 47, through-holes are cut in these insulating layers. Each through-hole is filled with a silicon semiconductor layer by well known selective epitaxial growth techniques. In this case, the growth is performed under the following conditions. For example, an H$_2$ gas of 100 l/min, an SiH$_2$Cl$_2$ gas of 400 ml/min, an HCl gas of 1 l/min, and a PH$_3$ gas of 10 ml/min serving as a doping gas are supplied to a reaction chamber under a reduced pressure of 100 Torr at a temperature of 900° C. N-type silicon semiconductor layers 51S and 51D each having a thickness of approximately 9,000 Å are then grown within the through-holes for 30 minutes. At this time, the silicon layer is not deposited on the insulating film which includes the silicon oxide layer 49 composed of the thermal oxide film 43, the PSG film 48 and the BPSG film 49, and the silicon nitride layer 50. An Al alloy containing about 1 wt % of Si is then deposited to a thickness of 5000 Å on the resultant structure by sputtering. Thereafter, the Al-Si layer is subjected to etching to provide interconnection layers 52S and 52D. In order to compare the present invention with the prior art, semiconductor devices having a conventional structure without the silicon nitride layer were manufactured.

Figure 3:
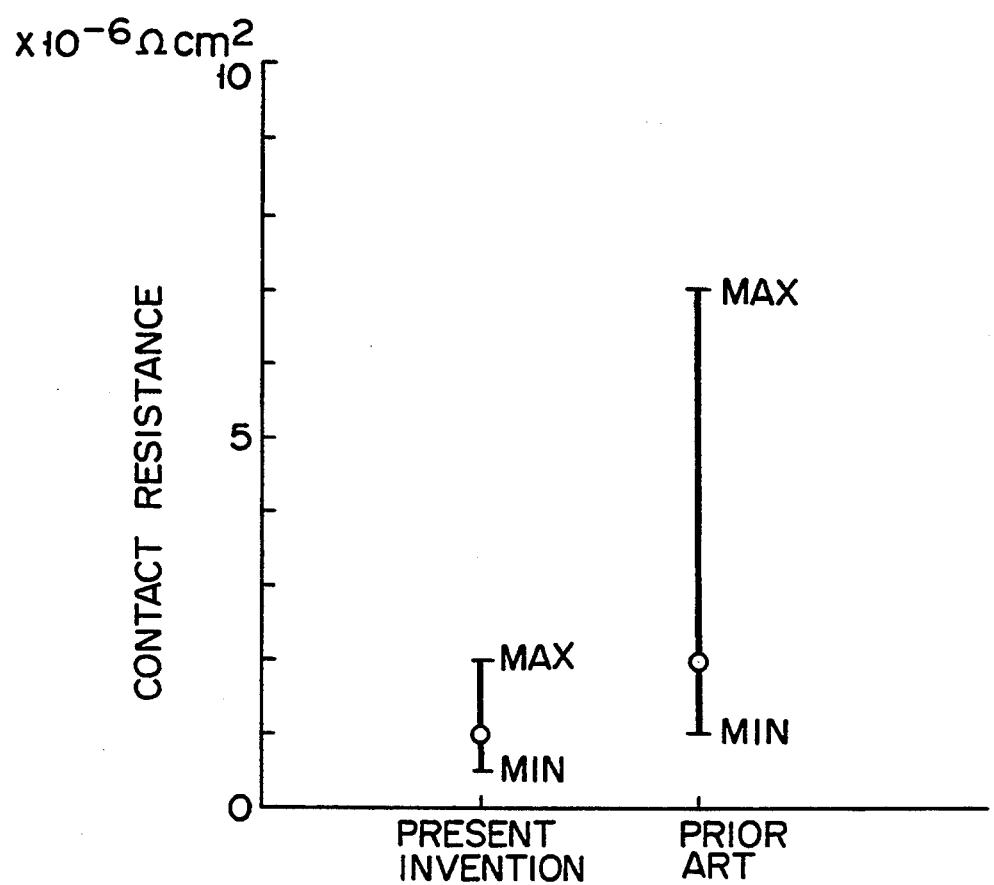
FIG. 3 is a graph showing a difference between contact resistance values in the present invention and the prior art.
Figure 4:
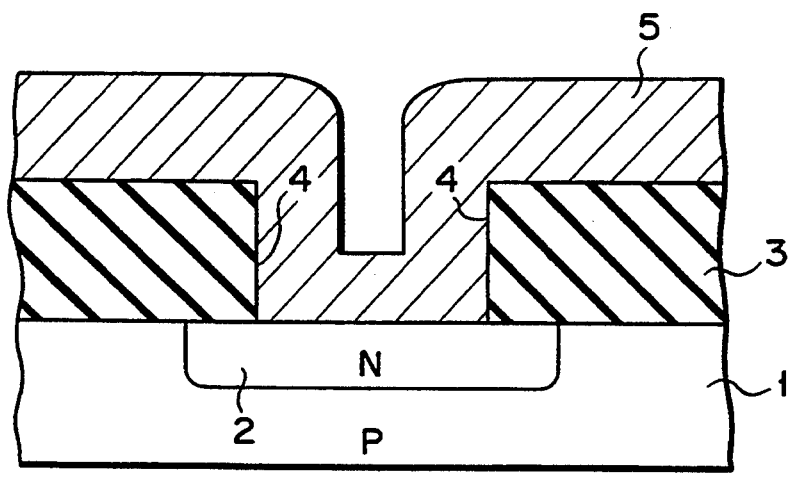
FIG. 4 is a sectional view of a through-hole with a large diameter in a conventional semiconductor device.
Figure 5:
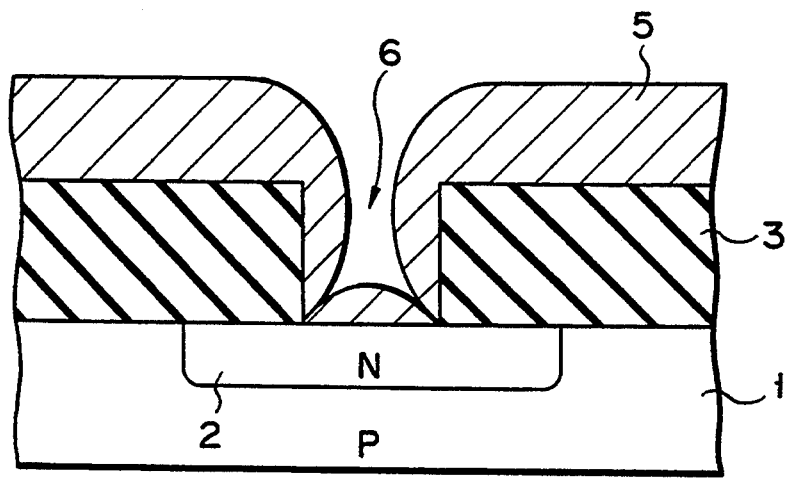
FIG. 5 is a sectional view of a through-hole with a small diameter in a conventional semiconductor device.
Figure 6:
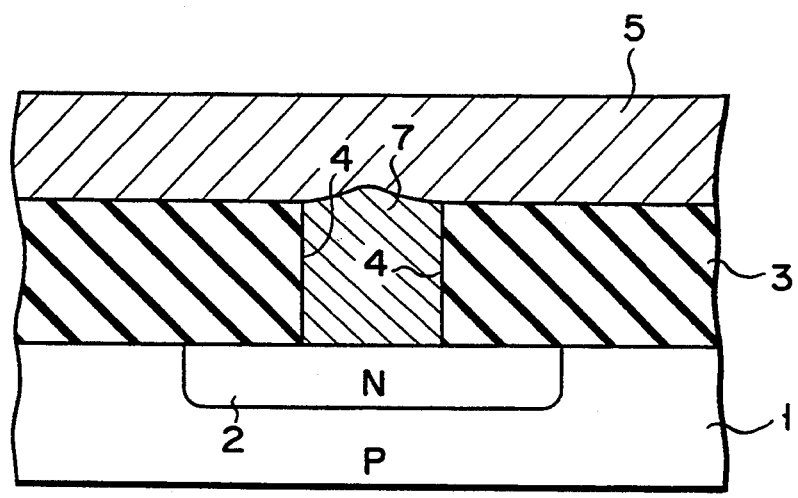
FIG. 6 is a sectional view of a through-hole provided by a contact hole filling technology in a conventional semiconductor device.

FIG. 3 shows measured results of contact resistance values of semiconductor devices according to both the present invention and the prior art, that is, resistance values between the source or drain region, 46 or 47, and the Al-Si interconnection layer 52 and 52D. The contact resistance ($\times 10^{-6}$ Ω·cm$^2$) is plotted along an axis of the ordinate. Each average value of the contact resistance values is represented by a mark o, and the dispersion in contact resistance values is represented by each line segment connecting a maximum value (MAX) and a minimum value (MIN). As shown in FIG. 3, the devices having the silicon nitride layer 50 according to the present invention have a smaller absolute value of the contact resistance and a smaller dispersion in contact resistance values than the conventional devices. A reason for high contact resistance in the prior art is considered as follows. That is, during the selective epitaxial growth, boron in the BPSG film may be added to the N-type silicon semiconductor layer to increase the contact resistance.

It has been described that the silicon oxide layer 49 is contaminated by the heavy metals to deteriorate the semiconductor devices. When such problem is taken into consideration in the comparison of the yield of the devices, the yield of devices according to the present invention is higher than that of conventional devices by about 10%.

In the embodiment described above, the through-hole is filled with the doped N-type silicon semiconductor layer, using the selective epitaxial growth. However, the through-hole may be filled with a non-doped silicon semiconductor layer, and an impurity ion implantation, an impurity diffusion in a dopant atmosphere or a solid phase diffusion may be then applied to the non-doped filled semiconductor layer to introduce a desired impurity thereinto. Polysilicon may be used as the filled semiconductor layer instead of the single crystal silicon.

As described above, according to the present invention, when the diffused region of the substrate is electrically connected to the interconnection layer on the insulating layer by the selective epitaxial growth of the through-hole, the silicon nitride layer provided on the silicon oxide layer serves as the insulating layer. Therefore, it is possible to reduce both the unwanted introduction of impurities into the silicon semiconductor layer grown in the through-holes and unwanted contamination of the silicon oxide layer due to the heavy metals. Accordingly, the controlled conductive property of the silicon semiconductor layer can be improved. At the same time, the deterioration of devices caused by the contamination of the silicon oxide layer can be eliminated.

In the embodiment described above, the integrated circuit including MOSFETs has been described as semiconductor devices. However, the present invention is not limited to the integrated circuits. The present invention will be applicable to another integrated circuits having a structure in which an interconnection layer on a silicon oxide layer is electrically connected to an active region of a semiconductor substrate through a conductive layer provided in a through-hole. The method of making the semiconductor device as described in the embodiment of the present invention may also be applicable to other integrated circuits.

What is claimed is:

1. A method of making a semiconductor device comprising the steps of:

selectively introducing an opposite conductivity type impurity into one conductivity type semiconductor substrate to provide at least one opposite conductivity type semiconductor region thereto;

sequentially forming a silicon oxide layer and an intermediate insulating layer on said semiconductor substrate;

depositing a silicon nitride layer on said intermediate insulating layer to prevent unwanted evaporation of an impurity contained in said intermediate insulating layer;

forming a through-hole in said silicon nitride layer, said intermediate insulating layer and said silicon oxide layer to reach and directly contact said semiconductor region;

filling said through-hole with a doped silicon material; and forming an interconnection layer on said silicon nitride layer to be electrically connected to said semiconductor region through said doped silicon material.

2. The method according to claim 1, wherein said intermediate insulating layer is composed of a silicon oxide film containing an impurity.

3. The method according to claim 2, wherein said silicon oxide film containing said impurity is a PSG film.

4. The method according to claim 2, wherein said silicon oxide film containing said impurity is a BSG film.

5. The method according to claim 2, wherein said silicon oxide film containing said impurity is a BPSG film.

6. The method according to claim 1, wherein said intermediate insulating layer is composed of a PSG film and a BPSG film.

* * * * *